(12) United States Patent
Trainin (10) Patent No.: US 7,350,131 B2
(45) Date of Patent: Mar. 25, 2008

(54) ERROR PROTECTING GROUPS OF DATA WORDS

(75) Inventor: Oded Trainin, Tel-Aviv (IL)

(73) Assignee: Cisco Technology, Inc., San Jose, CA (US)

( * ) Notice: Subject to any disclaimer, the term of this patent is extended or adjusted under 35 U.S.C. 154(b) by 119 days.

(21) Appl. No.: 11/040,678

(22) Filed: Jan. 22, 2005

(65) Prior Publication Data

US 2006/0168494 A1    Jul. 27, 2006

(51) Int. Cl.
  *H03M 13/00*    (2006.01)
(52) U.S. Cl. ..................... 714/758; 714/799
(58) Field of Classification Search ............... 714/752, 714/753, 758, 763, 799
  See application file for complete search history.

(56) References Cited

U.S. PATENT DOCUMENTS

| | | | |
|---|---|---|---|
| 3,648,254 A | 3/1972 | Beausoleil | 340/172.5 |
| 4,168,486 A | 9/1979 | Legory | 340/146.1 |
| 4,296,475 A | 10/1981 | Nederlof et al. | 364/900 |
| 4,692,922 A | 9/1987 | Kiriu et al. | 714/752 |
| 4,740,968 A | 4/1988 | Aichelmann, Jr. | 365/49 |
| 4,791,606 A | 12/1988 | Threewitt et al. | |
| 4,852,100 A | 7/1989 | Christensen et al. | 714/752 |
| 4,996,666 A | 2/1991 | Duluk, Jr. | 365/49 |
| 5,313,475 A | 5/1994 | Cromer et al. | 714/763 |
| 5,379,304 A | 1/1995 | Dell et al. | 370/392 |
| 5,383,146 A | 1/1995 | Threewitt | 365/49 |
| 5,440,715 A | 8/1995 | Wyland | 395/435 |
| 5,450,351 A | 9/1995 | Heddes | 365/49 |
| 5,774,481 A * | 6/1998 | Meaney et al. | 714/763 |
| 5,841,874 A | 11/1998 | Kempke et al. | 380/50 |
| 5,842,040 A | 11/1998 | Hughes et al. | 395/831 |
| 5,845,324 A | 12/1998 | White et al. | 711/128 |
| 5,978,885 A | 11/1999 | Clark, II | 711/708 |
| 6,041,389 A | 3/2000 | Rao | 711/708 |
| 6,047,369 A | 4/2000 | Colwell et al. | 712/217 |
| 6,069,573 A | 5/2000 | Clark, II et al. | 341/50 |
| 6,081,440 A | 6/2000 | Washburn et al. | 365/49 |
| 6,134,135 A | 10/2000 | Andersson | 365/49 |
| 6,137,707 A | 10/2000 | Srinivasan et al. | 365/49 |

(Continued)

OTHER PUBLICATIONS

U.S. Appl. No. 09/910,227, filed Jul. 20, 2001, Ross.

(Continued)

*Primary Examiner*—Shelly Chase
*Assistant Examiner*—Esaw Abraham
(74) *Attorney, Agent, or Firm*—The Law Office of Kirk D. Williams (57) ABSTRACT

Disclosed are, inter alia, methods, apparatus, data structures, computer-readable media, and mechanisms, for use in protecting groups of data words. One embodiment manipulates these data words to generate a resultant data word and an error correction code thereon for use in identifying a position of a bit error, with error detection codes used to identify which data word actually has the bit error. One embodiment retrieves a stored particular data word and its error detection code from memory or other storage. If an error is detected, the other data words in the group corresponding to the error correction code are acquired and are manipulated to produce a new resultant data word. The error correction code and the new resultant data word are used to identify the position of the bit error, with a corresponding bit position corrected in the particular data word.

25 Claims, 8 Drawing Sheets

U.S. PATENT DOCUMENTS

| | | | |
|---|---|---|---|
| 6,154,384 A | 11/2000 | Nataraj et al. | 365/49 |
| 6,175,513 B1 | 1/2001 | Khanna | 365/49 |
| 6,181,698 B1 | 1/2001 | Hariguchi | |
| 6,199,140 B1 | 3/2001 | Srinivasan et al. | 711/708 |
| 6,240,003 B1 | 5/2001 | McElroy | 365/49 |
| 6,246,601 B1 | 6/2001 | Pereira | 365/49 |
| 6,307,855 B1 | 10/2001 | Hariguchi | 370/392 |
| 6,374,326 B1 | 4/2002 | Kansal et al. | 711/708 |
| 6,377,577 B1 | 4/2002 | Bechtolsheim et al. | 370/392 |
| 6,389,506 B1 | 5/2002 | Ross et al. | 711/708 |
| 6,434,718 B1 * | 8/2002 | Kawahara et al. | 714/774 |
| 6,473,880 B1 * | 10/2002 | Cypher | 714/800 |
| 6,510,509 B1 | 1/2003 | Chopra et al. | 712/13 |
| 6,526,474 B1 | 2/2003 | Ross | 711/708 |
| 6,535,951 B1 | 3/2003 | Ross | 711/708 |
| 6,553,533 B2 * | 4/2003 | Demura et al. | 714/769 |
| 6,606,681 B1 | 8/2003 | Uzun | 711/708 |
| 6,618,281 B1 | 9/2003 | Gordon | |
| 6,675,341 B1 * | 1/2004 | Chen et al. | 714/753 |
| 6,715,029 B1 | 3/2004 | Trainin et al. | 711/708 |
| 6,717,946 B1 | 4/2004 | Hariguchi et al. | 370/392 |
| 6,728,124 B1 | 4/2004 | Ichiriu et al. | 365/49 |
| 6,732,227 B1 | 5/2004 | Baumann | 711/708 |
| 6,738,862 B1 | 5/2004 | Ross et al. | 711/708 |
| 2004/0015752 A1 | 1/2004 | Patella et al. | |
| 2004/0015753 A1 | 1/2004 | Patella et al. | |
| 2004/0030802 A1 | 2/2004 | Eatherton et al. | |
| 2004/0030803 A1 | 2/2004 | Eatherton et al. | |

OTHER PUBLICATIONS

U.S. Appl. No. 10/813,210, filed Mar. 29, 2004, Nagaraj.
U.S. Appl. No. 10/879,254, filed Jun. 29, 2004, Shoham et al.
"Soft Error in TCAMs: Causes and Cures," Sibercore Technologies, Jul. 2003, Kanata, ON, Canada.
"Technical Description of Turbo Product Codes," Version 4.0, Jun. 1999, Efficient Channel Coding, Inc., Orange, Ohio, USA.

\* cited by examiner

ERROR PROTECTING GROUPS OF DATA WORDS

TECHNICAL FIELD

One embodiment of the invention relates to communications and computer systems, especially networked routers, packet switching systems, computers and other devices that store and/or transport information; and more particularly, one embodiment relates to error protection for groups of data words by manipulating these data words to produce a resultant data word and an error correction code thereon for use in identifying a position of a bit error, and using an error detection code associated typically with each of the data words to identify whether or not a particular data word has a bit error.

BACKGROUND

Error-correcting and error-detecting codes are well-known. For example, ANDREW S. TANENBAUM, COMPUTER NETWORKS, Prentice-Hall, 1981, pp. 125-132, discusses error-correcting and error-detecting codes, and is hereby incorporated by reference. Assume a codeword contains n bits of which m are data bits and r are error-correcting or error-detecting bits (e.g., redundant or check bits), with n=m+r. There are many well-known ways to generate the error-detecting and error-correcting bits. Given two codewords, it is possible to determine how many bits differ (e.g., by exclusively-OR'ing or one bit summing the corresponding bits of the two codewords and summing these results). The number of bit positions in which two codewords or a set of codewords differ is called the Hamming distance. A Hamming distance of d, means that it will require d single-bit errors to convert one codeword to another codeword. To detect j errors, a Hamming distance of j+1 is required because with such a code, there is no way that j single-bit errors can change a valid codeword into another valid codeword. Similarly, to correct j errors, a distance 2j+1 code because that way the legal codewords are so far apart that even with j changes, the original codeword is still closer than any other codeword, so it can be uniquely determined.

Known storage techniques for protecting entries stored in random access memory (RAM) adds an error-correcting or error-detecting code to each memory entry. As part of a read operation of a memory location, the data portion and the error-correcting or error-detecting code is read, which is then used to detect a possible error and/or correct a discovered error in the data portion. If error correction is to be performed, then each entry requires a number of extra bits (the exact number of which depending on the size of the data and the error correction mechanism used), which in totality can consume a significant portion of the memory, or limit the size of a data value that can be stored in a memory entry (e.g., its physical number of bits minus the number of error correction bits). Desired are more efficient mechanisms for protecting data, which possibly may have the benefit of reducing the overall portion of the memory used to store error protection information.

SUMMARY

Disclosed are, inter alia, methods, apparatus, data structures, computer-readable media, and mechanisms, for use in protecting groups of data words. One embodiment manipulates these data words to generate a resultant data word and an error correction code thereon for use in identifying a position of a bit error, with error detection codes used to identify which data word actually has the bit error. One embodiment retrieves a stored particular data word and its error detection code from memory or other storage. If an error is detected, the other data words in the group corresponding to the error correction code are acquired and are manipulated to produce a new resultant data word. The error correction code and the new resultant data word are used to identify the position of the bit error, with a corresponding bit position corrected in the particular data word.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Disclosed are, inter alia, methods, apparatus, data structures, computer-readable media, and mechanisms, for use in protecting groups of data words.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value—the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage and signaling mechanisms including interfaces and devices such as network interface cards and buffers therein, as well as any communications devices and signals received and transmitted, and other current and evolving technologies that a computerized system can interpret, receive, and/or transmit. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium or media containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory," etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps.

Disclosed are, inter alia, methods, apparatus, data structures, computer-readable media, and mechanisms, for use in protecting groups of data words. One embodiment manipulates these data words to generate a resultant data word and an error correction code thereon for use in identifying a position of a bit error, with error detection codes used to identify which data word actually has the bit error. One embodiment retrieves a stored particular data word and its error detection code from memory or other storage. If an error is detected, the other data words in the group corresponding to the error correction code are acquired (e.g., retrieved from storage) and are manipulated to produce a new resultant data word. The error correction code and the new resultant data word are used to identify the position of the bit error, with a corresponding bit position corrected in the particular data word.

Thus, one embodiment does not require as much storage as would be needed if a full error correction code was stored in each data line for protecting its data word. Also, one embodiment, by using error detection to identify whether or not a data line includes an error, only requires that the other data line(s) containing the other portion(s) of the corresponding error correction code (or at least their error correction code portion(s)) need to be retrieved in response to a detected error (e.g., instead of reading all data lines with a portion of an error correction code, or at least their error correction code portions, every time one of these data lines is accessed—although all of these data lines, or at least their error correction code portions, are retrieved in one embodiment when one of these data lines is accessed).

One embodiment manipulates multiple data words to generate a resultant data word. An error correction code for the resultant data word is generated, with the error correction code including multiple error correction bits. Different subsets of the error correction bits are associated with at least two of the data words. For each particular data word, an error detection code is generated based on the particular data word and the associated subset of the error correction bits if any.

One embodiment transmits and/or stores the data words, the error correction code, and the error detection codes. After transmitting or storing, one embodiment: acquires the data, with this acquired data including a particular data word, its associated error detection code, and its the associated subset of the error correction bits if any; and performs an error detection operation on the acquired data. In one embodiment, in response to the error detection operation identifying an error condition, one embodiment performs an error correction operation on the acquired data. In one embodiment, this performing of the error correction operation includes generating a new resultant word based on the current values of the group of data words, identifying a bit position in the resultant data word to correct based on the resultant word and the error correction code, and correcting a corresponding bit position in the acquired data (e.g., the data word, the associated subset of the error correction bits, or the error detection code).

In one embodiment, storing of the data words, the error detection code, and the error detection codes includes: for each the data word, storing its value, its error detection code, and its associated subset of the multiple error correction bits if any in a same memory line in one or more memories. In one embodiment, manipulating the data words to generate the resultant data word includes exclusively-OR'ing bits of the data words. One embodiment includes means for performing each of these operations. One embodiment includes computer-readable media containing computer-executable instructions for performing each of these operations.

One embodiment performs an error detection check on a particular data word of a group of data words based on the particular data word and a particular error detection code. In response to an error condition being identified, data is manipulated to generate a resultant data word, with this data including the group of data words. An error correction operation is performed based on the resultant data word and on an associated predetermined error correction code to identify a bit position of an error. A bit in the particular data word corresponding to the bit position is corrected.

In one embodiment, each of the data words is included in one of the data lines, and the lines include the error detection code and multiple error protection codes, with each of the data words associated with a different one of the multiple error detection codes. In one embodiment, different subsets of the error correction code are stored in different data lines. In one embodiment, each of the data words is included in the data lines which are stored in one or more memories, with each of the multiple data lines including one of the data words and one of the error detection codes; and the particular data word and the particular error detection code are retrieved from the one or more memories.

In one embodiment, the error correction code is maintained in a register independent of the one or more memories; and the error correction code is retrieved from the register. In one embodiment, different portions of the error correction code are included in different lines of the multiple data lines. In one embodiment, a particular data line includes the particular data word, the particular error detection code, and a particular portion of the different portions of the error correction code, with the different portions including the particular portion and remaining portions. In response to the error condition identified by the error detection check, the remaining portions of the error correction code are retrieved. In one embodiment, the data words include the particular data word and remaining data words; and in response to the error condition identified by the error detection check, the remaining data words are retrieved from the one or more memories. One embodiment includes means for performing each of these operations. One embodiment includes computer-readable media containing computer-executable instructions for performing each of these operations.

One embodiment includes error detection and error correction capabilities and storage. The embodiment is configured to retrieve a data word of a group of data words and its associated error detection code from the storage and to manipulate current values of the group of data words, to generate a resultant data word, and to perform an error correction operation based on the resultant data word and its associated predetermined error correction code to identify a bit position corresponding to an error condition, and to correct a bit in the data word corresponding to the error condition to produce a corrected data word.

In one embodiment, manipulating the current values to generate the resultant data word includes exclusively-OR'ing the current values. One embodiment is configured to retrieve the other data words of the group of data words from memory for use in the manipulate operation in response to identifying an error condition from the error correction operation. One embodiment is configured to retrieve the predetermined error correction code from the storage in response to the identifying the error condition. In one embodiment, the storage is configured to retrieve a particular data line based on a particular address, the particular data line including the data word, its associated error detection code and a portion, but not all, of the predetermined error correction code.

One embodiment includes means for performing an error detection check on a particular data word of multiple data words based on the particular data word and a particular error detection code, means for manipulating data to generate a resultant data word in response to an error condition identified by the error detection check, the data including the multiple data words; means for performing an error correction operation based on the resultant data word and on an associated predetermined error correction code to identify a bit position of an error; and means for error correcting a bit in the particular data word corresponding to the bit position.

Figure 1A:
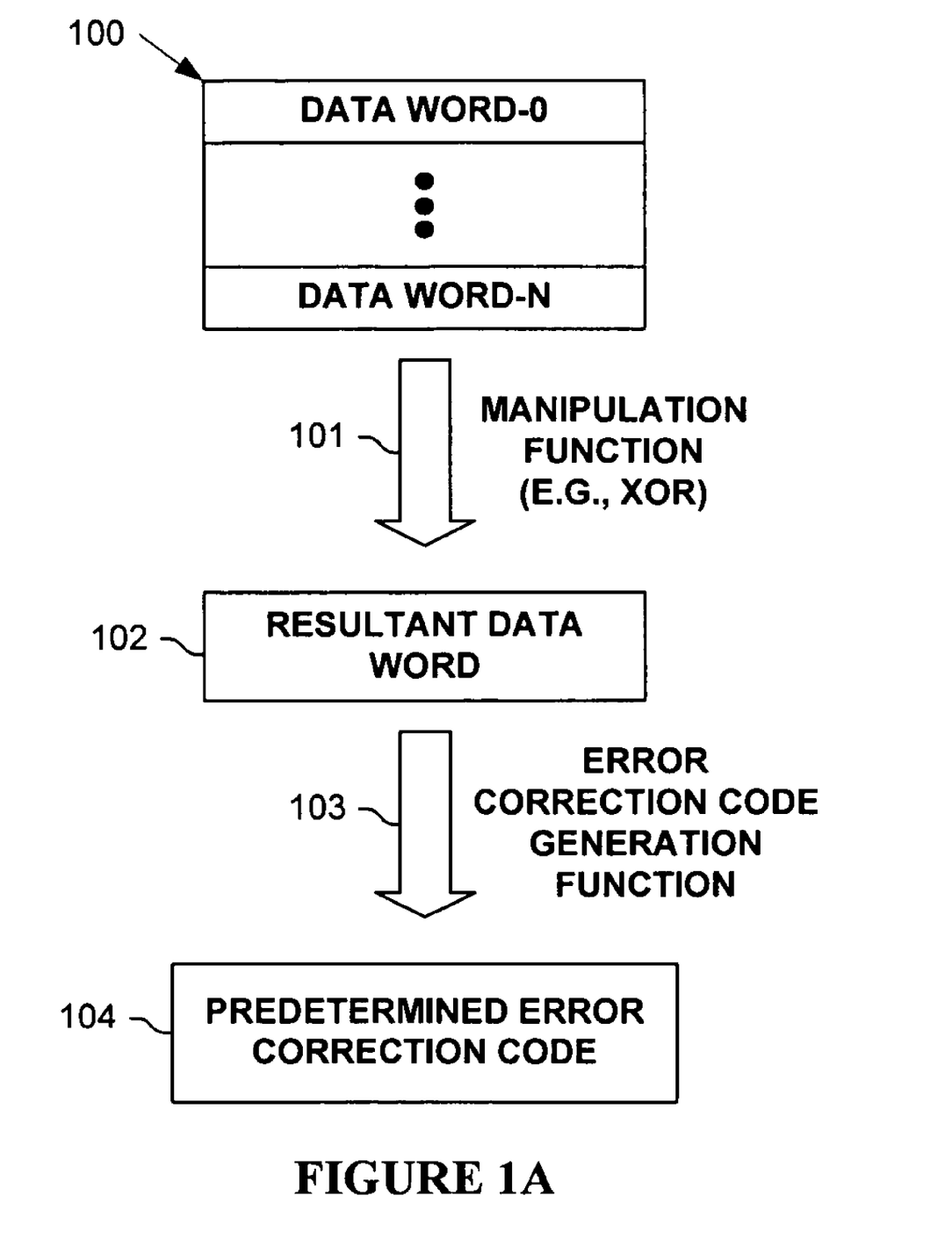
FIGS. 1A-C are block diagrams illustrating an mechanism of one embodiment for protecting a group of data words.
Figure 1B:
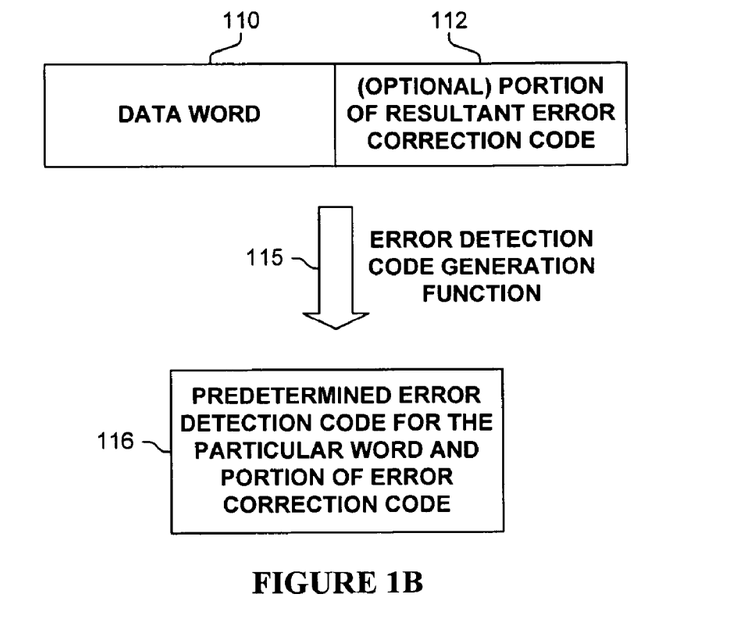
Figure 1C:
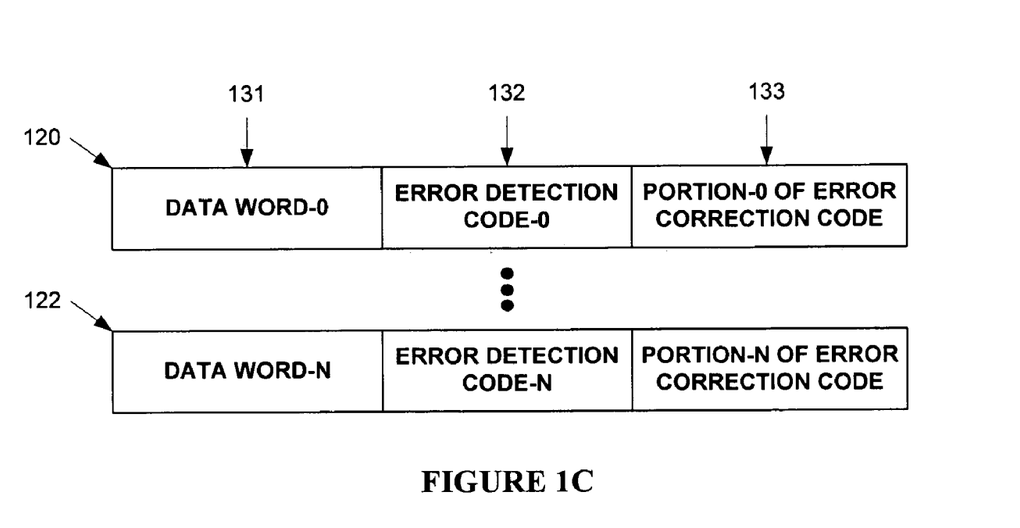

FIGS. 1A-C are block diagrams illustrating an mechanism of one embodiment for protecting a group of data words. As shown in FIG. 1A, a group of multiple data words 100 are manipulated (102) (e.g., combined in some fashion, such as, but not limited to exclusively-OR'ing each data word of the group of data words 100 together in some manner) to produce a resultant data word 104. An error correction code generation function (e.g., one of the well-known or any other function) is then applied (103) to resultant data word 102 to produce predetermined error correction code 104.

Illustrated in FIG. 1B is a process used in one embodiment to generate the error detection code for each of the data words of the group of data words. As shown, an error detection code function (e.g., one of the well-known or any other function, such as, but not limited to a parity generation function) is applied (115) to a data word 110 and possibly an associated subset 112 of the resultant error correction code 104 (FIG. 1A) to generate the predetermined error detection code 116 for data word 110, or data word 110 and an associated subset 112 of the resultant error correction code 104.

Illustrated in FIG. 1C are protected data lines 120-122 stored and/or transmitted in one embodiment. As shown, each of the protected data lines 120-122 includes a data word 131, an error detection code 132 for the corresponding data line 120-122, and possibly a subset 133 of the error correction code for the group of data words.

Figure 2A:
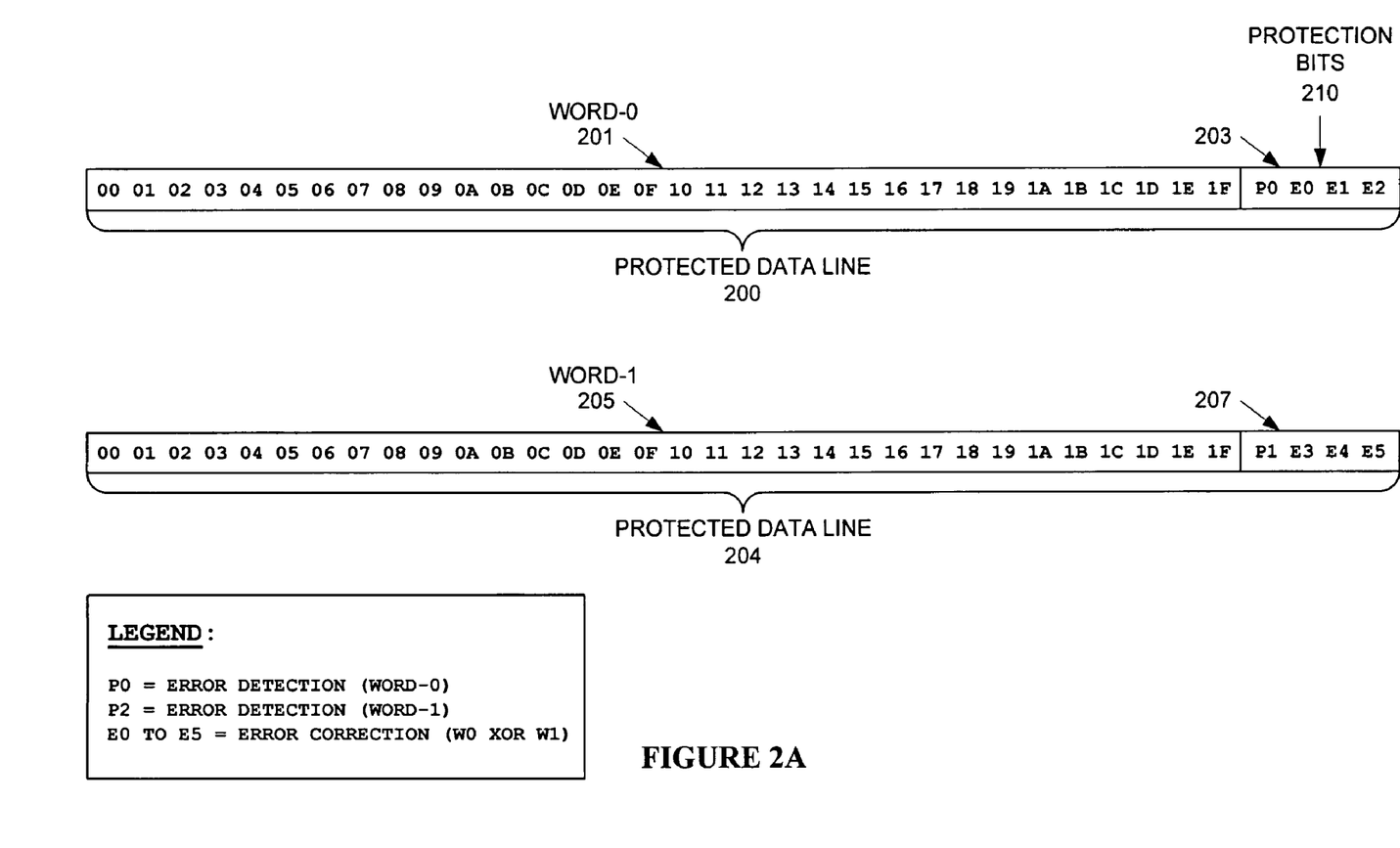
FIGS. 2A-C illustrate a few of an unlimited number ways in which protected data can be stored and/or transported in one embodiment.
Figure 2B:
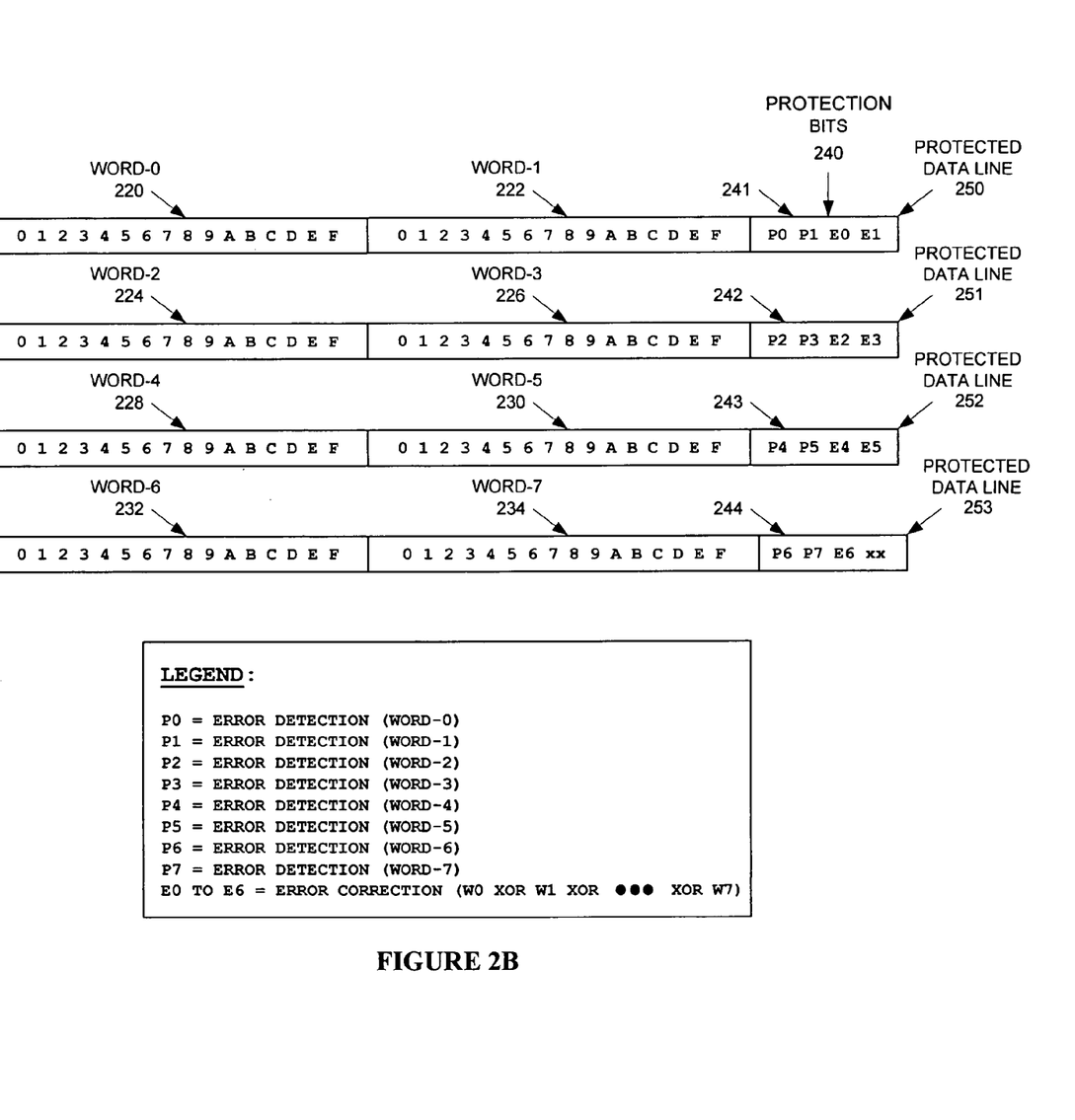
Figure 2C:
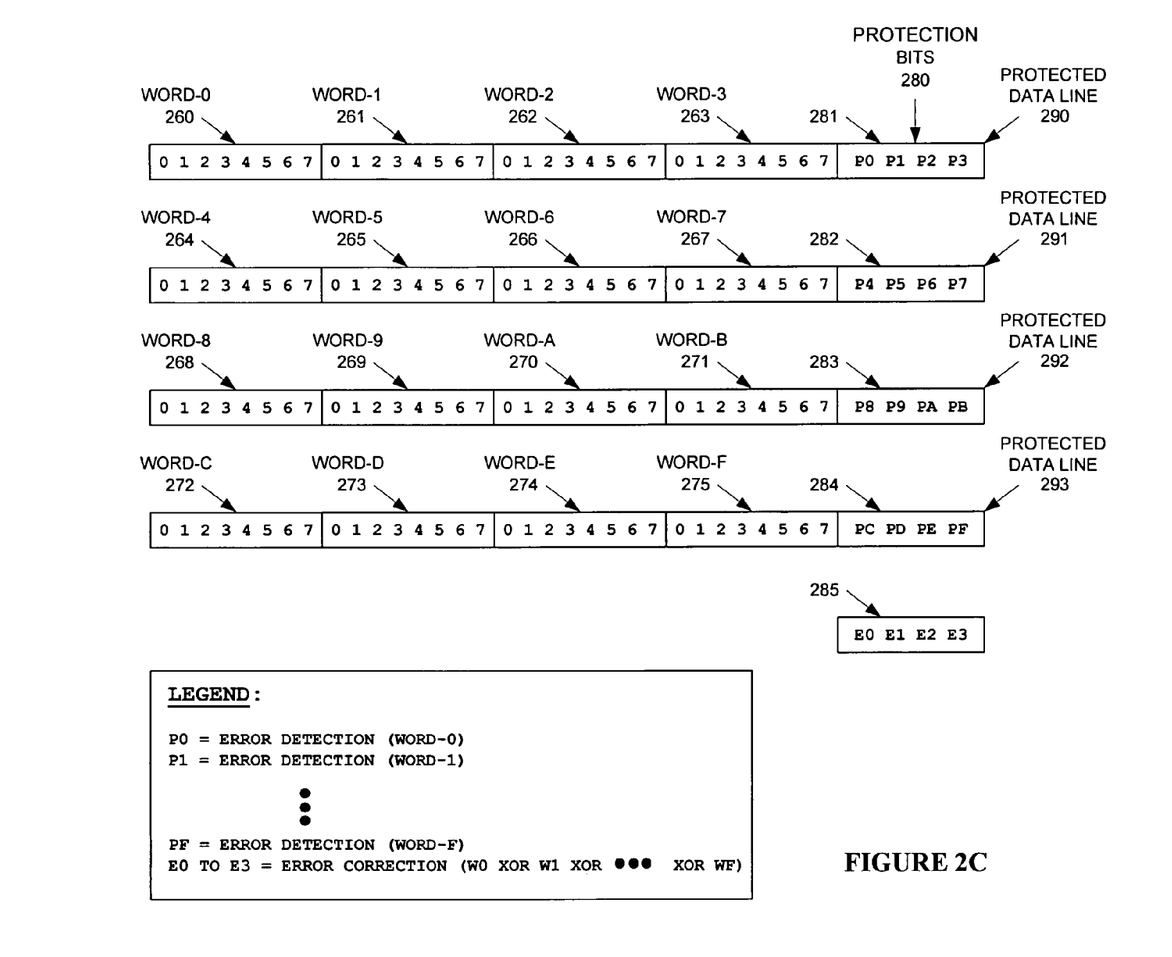

FIGS. 2A-C illustrate a few of an unlimited number ways in which protected data can be stored and/or transported in one embodiment. These are presented to illustrate the operation of a few embodiments of the invention, and to demonstrate the expansive scope of embodiments. As would be apparent to one skilled in the art, many variations are possible and within the scope and spirit of the invention.

Shown in FIG. 2A are two protected data lines 200 and 204, each containing a thirty-two bit data word (201, 205) and a set of protection bits 210 (203, 207). In one embodiment, data words 201 and 205 are manipulated (e.g., exclusively-OR'ed) to produce a 32-bit resultant data word on which an error correction code generation function is applied to generate a 6-bit error correction code. These six bits (E0 to E5) are distributed among protected data lines 200 and 204 as shown. Also, in one embodiment, a single bit error detection code generation function (e.g., a parity generator function) is applied to generate a single parity bit (P0 and P1) for each of the protected data lines 200, 204 (e.g., based on the data word, or the data word and its associated subset of error correction bits). Thus, in one embodiment, two thirty-six bit memory locations can be used to provide one bit error correction of a group of two thirty-two-bit data words.

Shown in FIG. 2B are four protected data lines 250-253, each containing two 16-bit data words 220-234 and a set of protection bits 240 (241-244). In one embodiment, data words 220-234 are manipulated (e.g., exclusively-OR'ed) to produce a 16-bit resultant data word on which an error correction code generation function is applied to generate a 7-bit error correction code. These seven bits (E0 to E6) are distributed among protected data lines 250-253 as shown. Also, in one embodiment, a single bit error detection code generation function (e.g., a parity generator function) is applied to generate a single parity bit (P0-P7) for each of the protected data words 220-234 (e.g., based on the data word, or the data word and its associated subset of error correction bits). Thus, in one embodiment, four thirty-six bit memory locations can be used to provide one bit error correction of a group of eight sixteen-bit data words.

Note, various error detection functions and error correction functions can be used by one embodiment in keeping with the scope and spirit of the invention. For example, shown in FIG. 2B is a 7-bit error correction code for correcting 16 bits. Note, one embodiment uses a 5-bit error correction code for correcting 16 bits, with these five bits typically distributed among the protected data words.

Shown in FIG. 2C are four protected data lines 290-293, each containing four 8-bit data words 260-275 and a set of protection bits 280 (281-285). In one embodiment, data words 260-275 are manipulated (e.g., exclusively-OR'ed) to produce an 8-bit resultant data word on which an error correction code generation function is applied to generate a 4-bit error correction code 285, which may be stored in storage along with protected data lines 290-293 or, for example, a separate memory, register or other location. Also, in one embodiment, a single bit error detection code generation function (e.g., a parity generator function) is applied to generate a single parity bit (P0-PF) for each of the protected data words 260-275 (e.g., based on the data word, or the data word and its associated subset of error correction bits). Thus, in one embodiment, four thirty-six bit memory locations can be used to provide one bit error correction of a group of sixteen eight-bit data words.

Figure 3A:
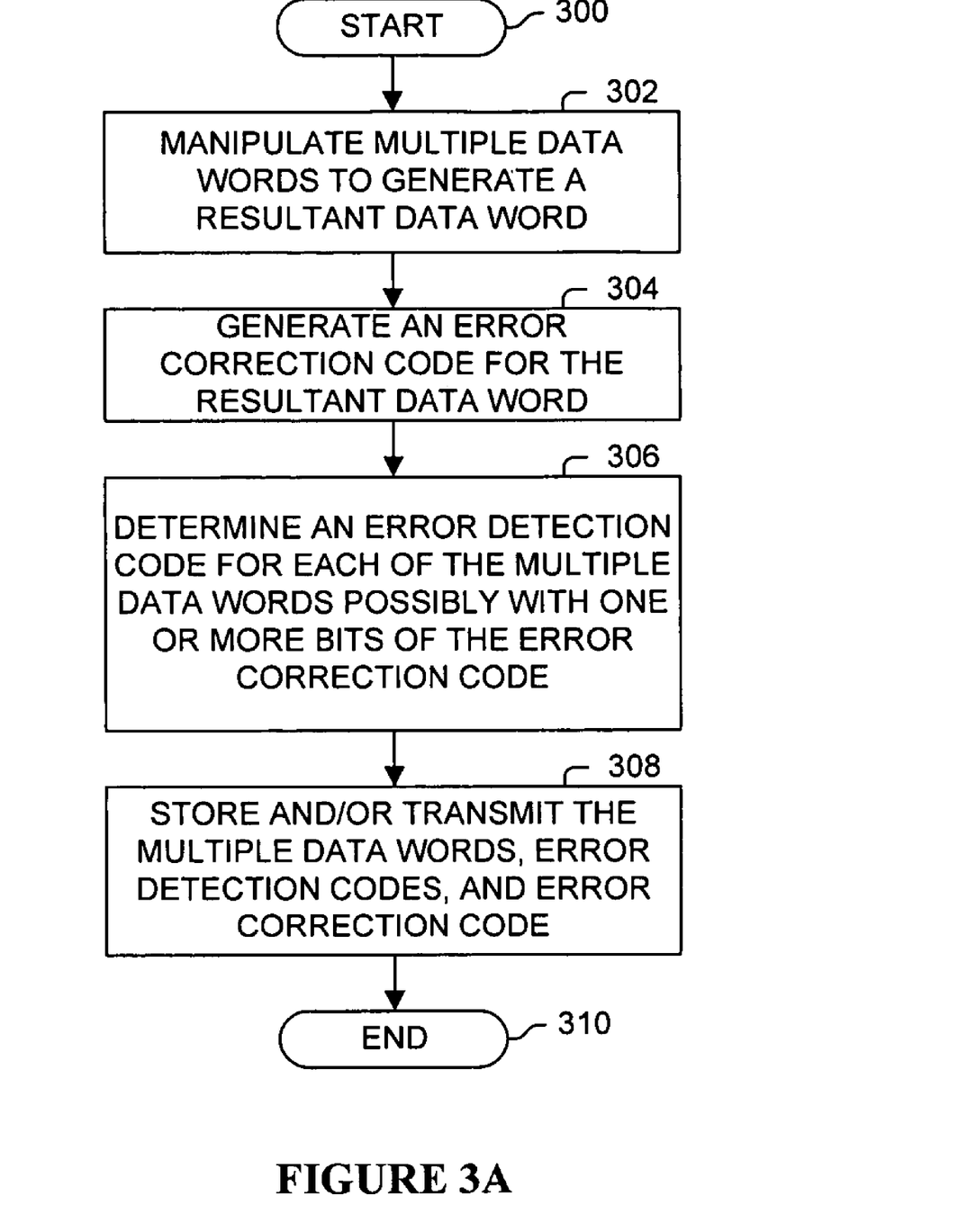
FIG. 3A illustrates a process used in one embodiment for generating protected data words.

FIG. 3A illustrates a process used in one embodiment for generating protected data words. Processing begins with process block 300, and proceeds to process block 302, wherein multiple data words are manipulated to generate a resultant data word. In process block 304, an error correction code for the resultant data word is generated. In process block 306, an error detection code is determined for each of the multiple data words and possibly an associated subset of the bits of the error correction code. In process block 308, the multiple data words, error detection codes, and error correction code are stored and/or transmitted. Processing is complete as indicated by process block 310.

Figure 3B:
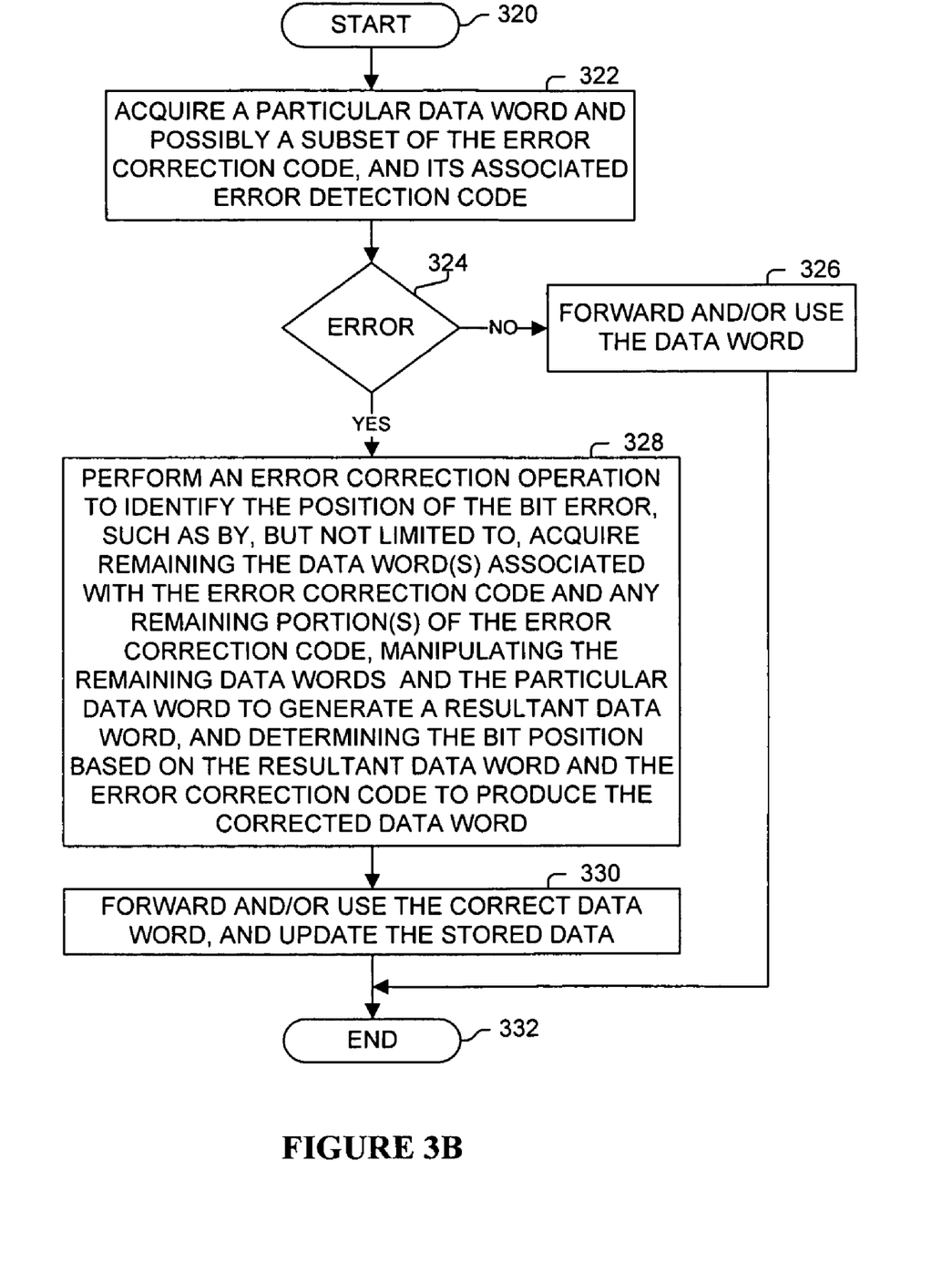
FIG. 3B illustrates a process used in one embodiment for error correcting a corrupted data word of a group of protected data words.

FIG. 3B illustrates a process used in one embodiment for error correcting a corrupted data word of a group of protected data words. Processing begins with process block 320, and proceeds to process block 322, wherein a particular data word and possibly a subset of the error correction code are acquired (e.g., retrieved from memory, received, etc.). As determined in process block 324, if an error is not detected in the acquired data (e.g., by performing an error detection function on the acquired data to identify whether or not the correct parity results), then in process block 326, the data word is forwarded and/or used in some fashion. Otherwise, an error was detected, and in process block 328, an error correction operation is performed to identify the position of the bit error, such as, but not limited to, acquiring any required remaining data word(s) and portion(s) of the error correction code, manipulating the (current values of, possibly including the bit in error) data words to generate a resultant data word, and determining the bit position of the bit in error based on the resultant data word and the error correction code. If the bit error is in the data word, it is corrected. In process block 330 the correct data word is forwarded and/or used in some fashion, and the storage is updated to correct the bit error. Processing is complete as indicated by process block 332.

Figure 4A:
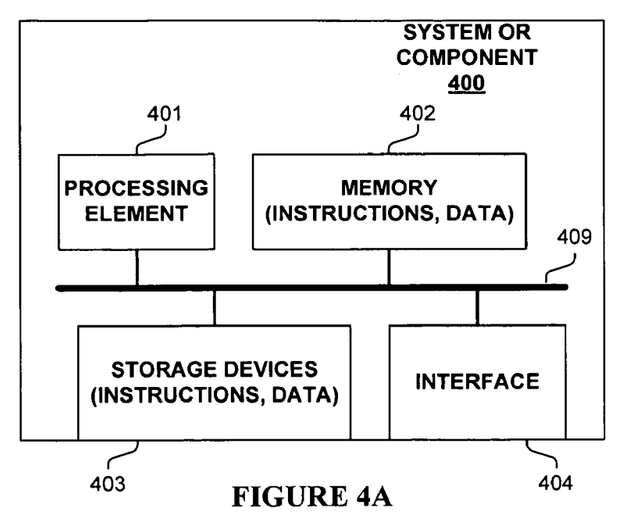
FIG. 4A illustrates a mechanism used in one embodiment for generating protected data words and/or error correcting a corrupted data word of a group of protected data words.

FIG. 4A is a block diagram of an exemplary system or component 400 used in one embodiment for generating protected data words and/or error correcting a corrupted data word of a group of protected data words. In one embodiment, system or component 400 performs one or more processes corresponding to one of the flow diagrams illustrated or otherwise described herein.

In one embodiment, component 400 includes a processing element 401 (e.g., a processor, customized logic, etc.), memory 402, storage devices 403, and an interface 404 for receiving and sending packets, items, and/or other information, which are typically coupled via one or more communications mechanisms 409 (shown as a bus for illustrative purposes.) Various embodiments of component 400 may include more or less elements. The operation of component 400 is typically controlled by processing element 401 using memory 402 and storage devices 403 to perform one or more scheduling tasks or processes. Memory 402 is one type of computer-readable medium, and typically comprises random access memory (RAM), read only memory (ROM), flash memory, integrated circuits, and/or other memory components. Memory 402 typically stores computer-executable instructions to be executed by processing element 401 and/or data which is manipulated by processing element 401 for implementing functionality in accordance with the invention. Storage devices 403 are another type of computer-readable medium, and typically comprise solid state storage media, disk drives, diskettes, networked services, tape drives, and other storage devices. Storage devices 403 typically store computer-executable instructions to be executed by processing element 401 and/or data which is manipulated by processing element 401 for implementing functionality in accordance with the invention.

Figure 4B:
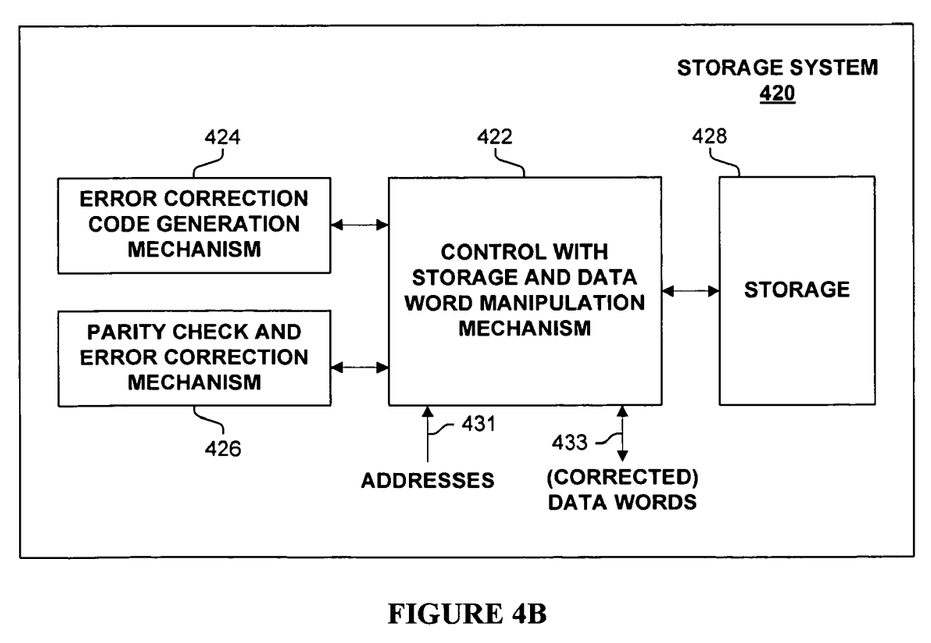
FIG. 4B illustrates a mechanism used in one embodiment for generating protected data words and/or error correcting a corrupted data word of a group of protected data words.

FIG. 4B illustrates a storage system 420 used in one embodiment for generating protected data words and/or error correcting a corrupted data word of a group of protected data words. In one embodiment, memory 402 (FIG. 4A) includes storage system 420. In one embodiment, storage devices 403 (FIG. 4A) includes storage system 420.

As shown, control 422 includes storage and data word manipulation functionality. An error correction code generation mechanism 424 is used to generate the error correction codes. A parity check and error correction mechanism 426 is used to generate parity codes and to corrected detected errors. Typically, the protected data lines including the protected data words are stored in storage 428. In one embodiment, the error detection and/or correction codes for a group of data words is stored in storage 428; while in one embodiment, the error detection and/or correction codes for a group of data words is stored in storage within control 422. In one embodiment, storage system 420 stores and retrieves data words 433 based on addresses 431 like a standard RAM, but also performs the data protection functionality.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method for protecting data, the method comprising:
   manipulating a plurality of data words to generate a resultant data word;
   generating an error correction code for the resultant data word, the error correction code including a plurality of error correction bits;
   associating different portions of the plurality of error correction bits with at least two of the plurality of data words;
   for each particular data word of the plurality of data words: generating an error detection code based on said particular data word and said associated portion of the plurality of error correction bits if any; and
   transmitting or storing said plurality of data words, said error correction code, and said plurality of error detection codes; after said transmitting or storing operation: acquiring data, said acquired data including: a particular data word of the plurality of data words, its associated said error detection code, and its said associated portion of the plurality of error correction bits if any; and performing an error detection operation on said acquired data.

2. The method of claim 1, comprising: in response to said error detection operation identifying an error condition: performing an error correction operation on said acquired data.

3. The method of claim 2, including in response to said identifying the error condition, acquiring one or more additional portions of said different portions of the plurality of error correction bits.

4. The method of claim 3, wherein said one or more additional portions of said different portions of the plurality of error correction bits are only acquired if said error detection operation identifies the error condition.

5. The method of claim 2, wherein said performing the error correction operation includes generating a new resultant word based on the current values of the plurality of data words, identifying a bit position in the resultant data word to correct based on the resultant word and the error correction code, and correcting a corresponding bit position in said acquired data.

6. The method of claim 1, wherein said storing said plurality of data words, said error correction code, and said plurality of error detection codes includes: for each said data word of the plurality of data words, storing its value, its said error detection code, and its associated portion of the plurality of error correction bits if any in a same memory line in one or more memories.

7. The method of claim 1, wherein said manipulating the plurality of data words to generate the resultant data word includes exclusively-OR'ing bits of the plurality of data words.

8. A method for protecting data, the method comprising:
   performing an error detection check on a particular data word of a plurality of data words based on the particular data word and a particular error detection code;
   in response to an error condition identified by said error detection check, manipulating data to generate a resultant data word, said data including the plurality of data words;
   performing an error correction operation based on the resultant data word and on an associated predetermined error correction code to identify a bit position of an error; and
   error correcting a bit in the particular data word corresponding to the bit position;
   wherein each of the plurality of data words is included in a different one of a plurality of data lines; wherein the plurality of data lines includes the error correction code and a plurality of error detection codes, with each of the plurality of data words associated with a different one of the plurality of error detection codes.

9. The method of claim 8, wherein different portions of the error correction code are stored in different data lines of the plurality of data lines.

10. A method for protecting data, wherein each of a plurality of data words is included in a plurality of data lines which are stored in one or more memories, each of the plurality of data lines includes one of the plurality of data words and one of a plurality of error detection codes; and the method comprises:
retrieving a particular data word of the plurality of data words and a particular error detection code of the plurality of error detection codes from said one or more memories;
performing an error detection check on the particular data word based on the particular data word and the particular error detection code;
in response to an error condition identified by said error detection check, manipulating data to generate a resultant data word, said data including the plurality of data words;
performing an error correction operation based on the resultant data word and on an associated predetermined error correction code to identify a bit position of an error; and
error correcting a bit in the particular data word corresponding to the bit position.

11. The method of claim 10, wherein the error correction code is maintained in a register independent of said one or more memories; and wherein the method includes retrieving the error correction code from the register.

12. The method of claim 10, wherein different portions of the error correction code are included in different lines of the plurality of data lines.

13. The method of claim 12, wherein a particular data line of said plurality of data lines includes the particular data word, the particular error detection code, and a particular portion of said different portions of the error correction code, said different portions including the particular portion and remaining portions; and the method includes: in response to the error condition identified by said error detection check, retrieving the remaining portions of said error correction code.

14. A method for protecting data, the method comprising:
performing an error detection check on a particular data word of a plurality of data words based on the particular data word and a particular error detection code, wherein the plurality of data words includes the particular data word and remaining data words;
in response to an error condition identified by said error detection check: retrieving the remaining data words from one or more memories, and manipulating data to generate a resultant data word, said data including the plurality of data words;
performing an error correction operation based on the resultant data word and on an associated predetermined error correction code to identify a bit position of an error; and
error correcting a bit in the particular data word corresponding to the bit position.

15. An apparatus for protecting data, the apparatus comprising:
means for manipulating a plurality of data words to generate a resultant data word;
means for generating an error correction code for the resultant data word, the error correction code including a plurality of error correction bits;
means for associating different portions of the plurality of error correction bits with at least two of the plurality of data words;
means for generation for each particular data word of the plurality of data words: an error detection code based on said particular data word and said associated portion of the plurality of error correction bits if any; and
means for storing said plurality of data words, said error correction code, and said plurality of error detection codes;
means for acquiring data, said acquired data including: a particular data word of the plurality of data words, its associated said error detection code, and its said associated portion of the plurality of error correction bits if any; and
means for performing an error detection operation on said acquired data.

16. The apparatus of claim 15, comprising: means for performing an error correction operation on said acquired data in response to said error detection operation identifying an error condition.

17. The apparatus of claim 16, including means for acquiring one or more additional portions of said different portions of the plurality of error correction bits in response to said identifying the error condition.

18. The apparatus of claim 16, wherein said means for performing the error correction operation includes means for generating a new resultant word based on the current values of the plurality of data words, means for identifying a bit position in the resultant data word to correct based on the resultant word and the error correction code, and means for correcting a corresponding bit position in said acquired data.

19. The apparatus of claim 15, wherein said means for storing said plurality of data words, said error correction code, and said plurality of error detection codes includes: for each said data word of the plurality of data words, storing its value, its said error detection code, and its associated portion of the plurality of error correction bits if any in a same memory line in one or more memories.

20. One or more computer-readable media tangibly encoded thereon with computer-executable instructions for performing operations when executed by one or more processing elements, said operations comprising:
performing an error detection check on a particular data word of a plurality of data words based on the particular data word and a particular error detection code;
in response to an error condition identified by said error detection check, manipulating data to generate a resultant data word, said data including the plurality of data words;
performing an error correction operation based on the resultant data word and on an associated predetermined error correction code to identify a bit position of an error; and
error correcting a bit in the particular data word corresponding to the bit position;
wherein each of the plurality of data words is included in a different one of a plurality of data lines; wherein the plurality of data lines includes the error correction code and a plurality of error detection codes, with each of the plurality of data words associated with a different one of the plurality of error detection codes.

21. An apparatus for protecting data, the apparatus comprising:
one or more memories, wherein each of a plurality of data words is included in a plurality of data lines stored in said one or more memories, each of the plurality of data lines includes one of the plurality of data words and one of a plurality of error detection codes;

means for retrieving a particular data word of the plurality of data words and a particular error detection code of the plurality of error detection codes from said one or more memories;

means for performing an error detection check on the particular data word based on the particular data word and the particular error detection code;

means for, in response to an error condition identified by said error detection check, manipulating data to generate a resultant data word, said data including the plurality of data words;

means for performing an error correction operation based on the resultant data word and on an associated predetermined error correction code to identify a bit position of an error; and means for error correcting a bit in the particular data word corresponding to the bit position.

22. The apparatus of claim 21, comprising:

a register independent of said one or more memories, wherein the error correction code is maintained in the register; and means for retrieving the error correction code from the register.

23. The apparatus of claim 21, wherein different portions of the error correction code are included in different lines of the plurality of data lines.

24. The apparatus of claim 23, wherein a particular data line of said plurality of data lines includes the particular data word, the particular error detection code, and a particular portion of said different portions of the error correction code, said different portions including the particular portion and remaining portions; and wherein the apparatus includes means for, in response to the error condition identified by said error detection check, retrieving the remaining portions of said error correction code.

25. An apparatus for protecting data, the apparatus comprising:

means for performing an error detection check on a particular data word of a plurality of data words based on the particular data word and a particular error detection code, wherein the plurality of data words includes the particular data word and remaining data words;

means for performing operations in response to an error condition identified by said error detection check, said operations including: retrieving the remaining data words from one or more memories, and manipulating data to generate a resultant data word, said data including the plurality of data words;

means for performing an error correction operation based on the resultant data word and on an associated predetermined error correction code to identify a bit position of an error; and means for error correcting a bit in the particular data word corresponding to the bit position.

* * * * *